United States Patent
Huisman et al.

(10) Patent No.: US 6,519,725 B1
(45) Date of Patent: Feb. 11, 2003

(54) DIAGNOSIS OF RAMS USING FUNCTIONAL PATTERNS

(75) Inventors: Leendert M. Huisman, South Burlington, VT (US); Ya-Chieh Lai, Ibaraki (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 08/811,605

(22) Filed: Mar. 4, 1997

(51) Int. Cl.$^7$ ............................................. G11C 29/00
(52) U.S. Cl. ...................................................... 714/718
(58) Field of Search ................................. 371/21.2, 21.3, 371/21.4, 21.6, 25.1; 365/201, 189.01; 714/718–720, 723, 29, 725; 345/189; 370/241

(56) References Cited

U.S. PATENT DOCUMENTS

| | | | |
|---|---|---|---|
| 4,315,330 A | 2/1982 | Brickman et al. | 370/241 |
| 5,034,923 A | 7/1991 | Kuo et al. | 365/189.01 |
| 5,132,973 A | 7/1992 | Obermeyer | 714/718 |
| 5,136,590 A | 8/1992 | Polstra et al. | 714/29 |
| 5,250,940 A | 10/1993 | Valentaten et al. | 345/189 |
| 5,436,910 A | 7/1995 | Takeshima et al. | 714/718 |
| 5,471,482 A | 11/1995 | Byers et al. | 714/719 |

FOREIGN PATENT DOCUMENTS

| | | | |
|---|---|---|---|
| JP | 0121544 | 1/1989 | G06F/11/22 |
| JP | 0133647 | 2/1989 | G06F/12/16 |
| JP | 0561780 | 3/1993 | G06F/12/16 |

OTHER PUBLICATIONS

NN8802183; "Tester–Loop–Independent Simulation in the Presence of Memory;" IBM Technical Disclosure Bulletin, Feb. 1988, US; vol. No.: 30, Issue No.: 9, p. No.: 183–186.*

NN9403283: "Fuse Book Offering Redundancy Test Immediately;" IBM Technical Disclosure Bulletin, Mar. 1994, US, vol. No.: 37, Issue No.: 3, p. No.: 283–286.*

IBM Technical Disclosure Bulletin vol. 38 No. 09B Sep. 1993, "Hierarchical and Reconfigurable Test Control Structure Useable For System Diagnostic Functions" by Berry, Jr., Brey, Celtruda, Dobrzynski, Meltzer, Phillips and Wagner, pp. 87–89.

IBM Technical Disclosure Bulletin vol. 38 No. 07 Jul. 1995, "Test Friendly Scheme For Read Only Storage" by Bredin and Renard, pp. 397–399.

IBM Technical Disclosure Bulletin vol. 38 No. 07 Jul. 1995, "Low–Inductance, Low–Resistance, Write Head For High Data Rate Application" by Anderson, pp. 465–466.

* cited by examiner

*Primary Examiner*—Albert Decady
*Assistant Examiner*—Guy Lamarre
(74) *Attorney, Agent, or Firm*—Eugene I. Shikurko; Mark F. Chadurjian

(57) ABSTRACT

A methodology for testing embedded memories based on functional patterns that allow for easy and complete diagnosis including techniques for shortening the size of the array test, and/or the simulation turn around time, without diminishing the diagnostic accuracy.

15 Claims, 14 Drawing Sheets

(a) TWO FAULTS AFFECTING THE SAME CELL (b) PROPAGATING FAULTS

| TRIGGER AT SOURCE | EXPECTED VALUE AT TARGET | (STEP n−1) | TRIGGER FAULT (STEP n) | (STEP n+1) |
|---|---|---|---|---|
| 0 | 0 | DON'T CARE | ⇓w0 | ⇓r0 |
| 0 | 1 | ⇑w1 | ⇑r1w0 | DON'T CARE |
| 1 | 0 | ⇑w0 | ⇑r0w1 | DON'T CARE |
| 1 | 1 | DON'T CARE | ⇓w1 | ⇓r1 |

TABLE A: CATCHING COUPLING FAULTS: SOURCE CELL PRECEDES TARGET CELL

| TRIGGER AT SOURCE | EXPECTED VALUE AT TARGET | (STEP n−1) | TRIGGER FAULT (STEP n) | (STEP n+1) |
|---|---|---|---|---|
| 0 | 0 | DON'T CARE | ⇑w0 | ⇑r0 |
| 0 | 1 | ⇓w1 | ⇓r1w0 | DON'T CARE |
| 1 | 0 | ⇓w0 | ⇓r0w1 | DON'T CARE |
| 1 | 1 | DON'T CARE | ⇑w1 | ⇑r1 |

TABLE B: CATCHING COUPLING FAULTS: TARGET CELL PRECEDES SOURCE CELL

(a) WRITING A 1 IN x
    FORCES A 1 TO y
    OR
    WRITING A 0 IN y
    FORCES A 1 IN x

1. ⇑w0
2. ⇑r0w1r1w1
3. ⇑(r1)w0r0w0
4. ⇑r0
5. ⇓w1
6. ⇓r1w0r0w0
7. ⇓r0w1r1w1
8. ⇓r1

(b) WRITING A 0 IN x
    FORCES A 0 TO y
    OR
    WRITING A 1 IN y
    FORCES A 0 IN x

1. ⇑w0
2. ⇑r0w1r1w1
3. ⇑r1w0r0w0
4. ⇑r0
5. ⇓w1
6. ⇓r1w0r0w0
7. ⇓(r0)w1r1w1
8. ⇓r1

(c) WRITING A 0 IN x
    FORCES A 1 TO y
    OR
    WRITING A 1 IN y
    FORCES A 1 IN x

1. ⇑w0
2. ⇑r0w1r1w1
3. ⇑r1w0r0w0
4. ⇑r0
5. ⇓w1
6. ⇓(r1)w0r0w0
7. ⇓r0w1r1w1
8. ⇓(r1)

(d) WRITING A 1 IN x
    FORCES A 0 TO y
    OR
    WRITING A 0 IN y
    FORCES A 0 IN x

(a) WRITING A 1 IN X
    INVERTS Y

1. ⇑w0
2. ⇑(r0)w1r1w1
3. ⇑r1w0r0w0
4. ⇑(r0)
5. ⇓w1
6. ⇓(r1)w0r0w0
7. ⇓r0w1r1w1
8. ⇓r1

(b) WRITING A 0 IN Y
    INVERTS X

1. ⇑w0
2. ⇑r0w1r1w1
3. ⇑(r1)w0r0w0
4. ⇑r0
5. ⇓w1
6. ⇓r1w0r0w0
7. ⇓(r0)w1r1w1
8. ⇓r1

(c) WRITING A 0 IN X
    INVERTS Y
    OR
    WRITING A 1 IN Y
    INVERTS X

(a) WRITING A VALUE IN X
    FORCES Y TO THE SAME
    VALUE

1. ⇑w0
2. ⇑r0w1r1w1
3. ⇑r1w0r0w0
4. ⇑r0
5. ⇓w1
6. ⇓(r1)w0r0w0
7. ⇓(r0)w1r1w1
8. ⇓r1

(b) WRITING A VALUE IN Y
    FORCES X TO THE SAME
    VALUE

FIG.13

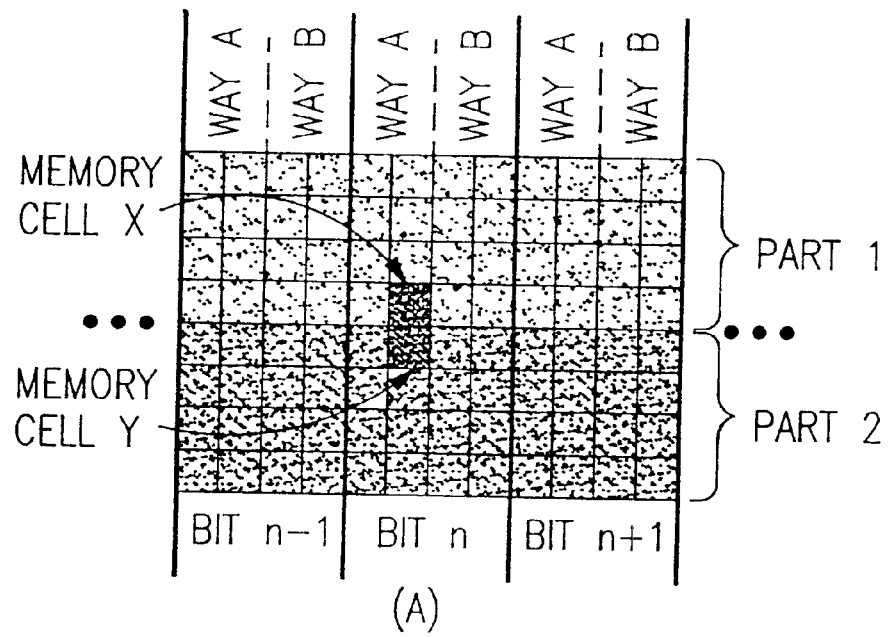
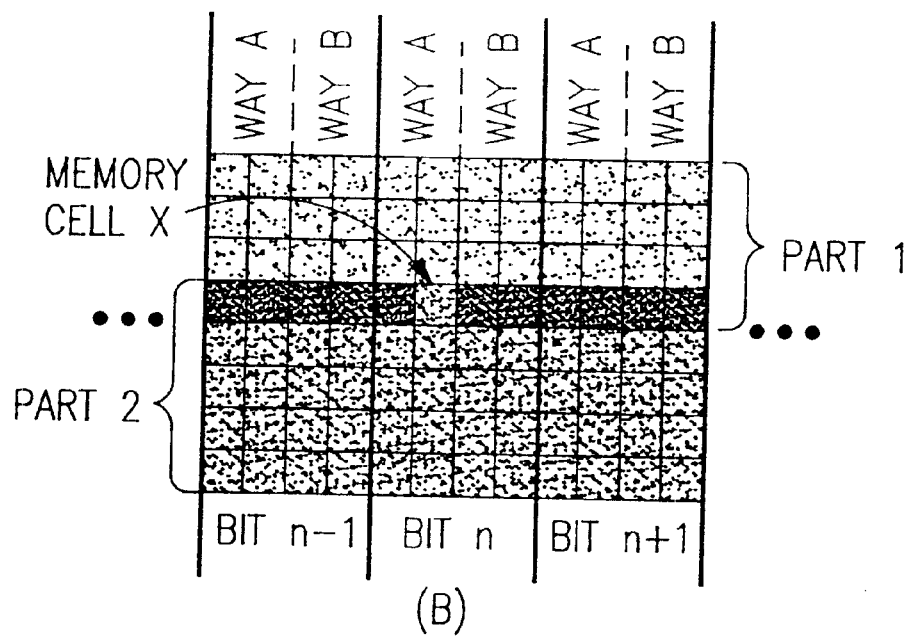
FIG.19

DIAGNOSIS OF RAMS USING FUNCTIONAL PATTERNS

BACKGROUND OF THE INVENTION

1. Technical Field of the Invention

This invention pertains to testing electronic memory. In particular, this invention describes a method and apparatus for testing and diagnosing RAM failures on the fly and for providing fast and reliable information about individual RAM defects.

2. Background Art

RAM testing is a process of exercising RAM and determining whether or not the memory behaves correctly. If the memory misbehaves, diagnosis is performed on the memory to determine the cause of the misbehavior. As the complexity of microprocessors continues to increase, so, too, does the importance of memory test and diagnosis. During manufacturing test is the most important component because bad memory chips need to be identified and discarded. The second important step, diagnosis, becomes crucial when the yield is low and it becomes necessary to pinpoint the defects or family of defects that are bringing down the yield.

The invention described herein involves the test and diagnosis of memory arrays embedded in a large microprocessor, for example, a translation look-aside buffer. Larger memory arrays on the processor chip are tested using built-in self-test (BIST). However, the number and size of smaller arrays does not warrant the design time nor the chip space to test them using BIST. The approach to testing smaller arrays is to use functional patterns, whereby the pins of the chip are driven with stimuli and then observed for responses while the chip is operating in functional mode, i.e. as it would normally operate. Essentially, the test algorithm is run on the chip in the form of a working program.

The present invention is directed to a test strategy, method, and apparatus that is based on functional test patterns. In general, functional patterns require too much time due to the demands of pattern generation and fault simulation. However, these shortcomings are surmountable for the case of memory array testing and diagnosis. For memory arrays, pattern generation is not as much of a problem because memory is structurally very regular, and fault simulation is not required. For normal array tests it is known what defects, and what combination of defects, are covered. Finally, the use of functional patterns makes it possible to use to on-chip caching mechanisms to reduce the actual number of test vectors that have to be stored in the test buffer.

Using functional patterns does complicate the diagnosis however, although not more so than using BIST. The main problem is that the tester is a passive supplier of clock signals and input stimuli, and is not involved in interpreting the observed fail data beyond merely recording them. In order to do diagnosis, however, information on which bits in the RAM are failing and what phase of the test made that observation has to be recorded. The information on the phase of the test can be reconstructed, of course, from the vector number, but that is an awkward, and rather inflexible, approach.

The present invention provides, first, an accurate diagnosis within a given granularity of a diagnostic procedure (given the set of tests that were employed) and, second, achieving that level of granularity in an acceptable way, that is, without extensive post test analysis and simulation. An additional, and equally important, provision is a reduction of tester buffer requirements, simulation, and test vector generation turn-around times, etc., without compromising the optimum potential granularity.

It is an object of the invention to provide an improved methodology for memory array diagnosis.

It is another object of the invention to provide an article of manufacture for implementing an improved test and diagnosis methodology for memory arrays.

SUMMARY OF THE INVENTION

The present invention is directed to a test strategy that is 1) based on functional patterns, and 2) allows for easy diagnosis, with the emphasis on diagnosis and not so much on test. Therefore, the description of which tests catch the faults is not directed towards the most efficient tests, but to tests that allow for diagnosis. The requirement of easy diagnosibility led to several novel advancements and to novel accommodations as to how the tests can be modified to alleviate pattern generation and simulation bottlenecks.

Briefly, the diagnostic flow proceeds as follows: first, test patterns are generated. These patterns are applied by the tester to the chip being tested. The tester continues applying the patterns, collecting fail data, if any, in the process. Unlike go/no-go testing, the tester does not stop on first exposure. The resulting tester output is then analyzed to generate a failure bitmap. By applying the criteria described in detail below, a final diagnosis can be made.

The goal of easy and full diagnosibility does not require tests in which the processor itself is involved in detecting faults. It also restricts the kind of optimizations that can be performed to reduce the tester time, the required tester buffer size, and the simulation turnaround time.

Other features and advantages of this invention will become apparent from the following detailed description of the presently preferred embodiment of the invention, taken in conjunction with the accompanying drawings.

BRIEF DESCRIPTION OF THE DRAWINGS

FIGS. 10a–b illustrate components for catching coupling faults.

FIGS. 11a–d illustrate fault signatures of idempotent faults.

FIGS. 12a–c illustrate fault signatures of inversion faults.

FIGS. 13a–b illustrate fault signatures of state-coupling faults.

FIG. 19 illustrates preserving coupling faults.

BEST MODE FOR CARRYING OUT THE INVENTION

Fault Model

Even though all faults have some physical root cause, it is desired that these physical faults be modelled as logical faults. For instance, one physical fault in a memory cell is a short to ground. The logical equivalent of this fault might be that the cell is stuck at 0. There are two advantages to this layer of abstraction. First, methods to catch these logical faults can be valid across different physical implementations. Second, this abstraction simplifies the problem tremendously. For instance, there could be any number of physical reasons for a cell to be stuck at 0, but the idea of a "stuck at 0" is cleaner and simplifies the reasoning.

Figure 1:
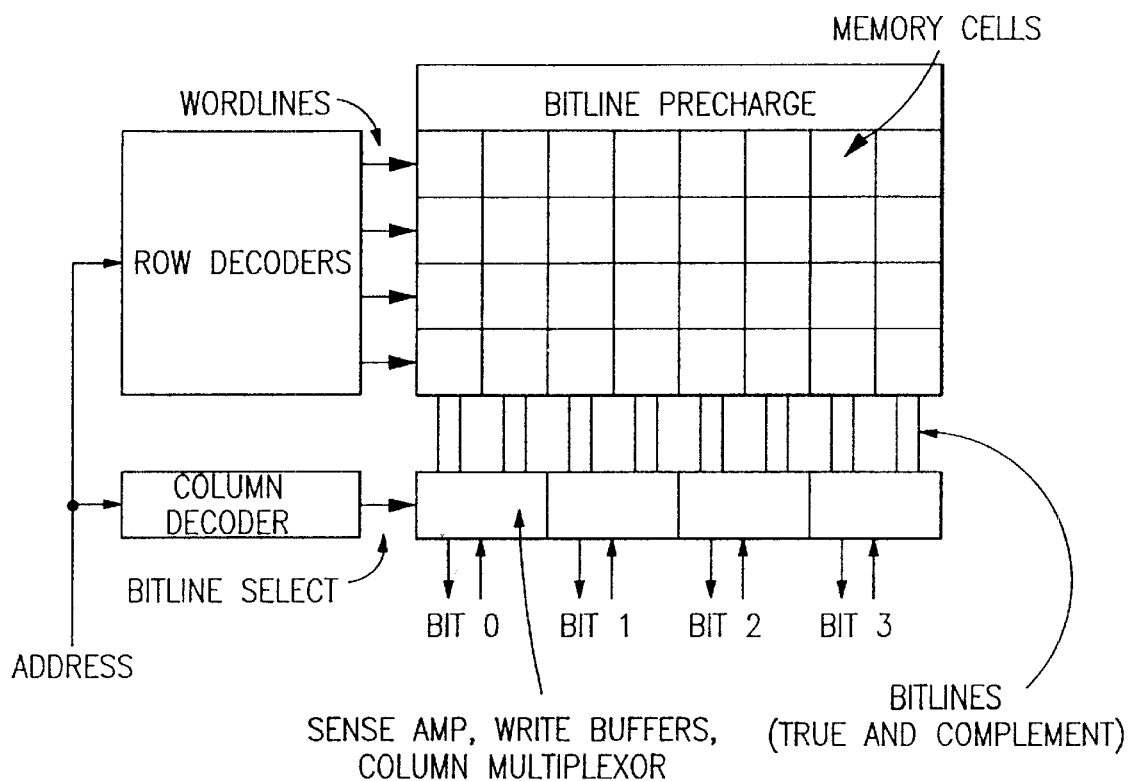
FIG. 1 illustrates a generic memory array architecture.

Referring to the generic memory array architecture of FIG. 1, the row decoders, column decoders, bitline selectors, and wordlines shown therein form the address decoder. The bitlines, sense amplifiers, bitline precharge logic, column multiplexor (mux,) write buffers, and data out lines form the read/write logic. The collection of individual memory cells form the memory cell array.

Faults in the read/write logic and address decoder can be mapped back onto the memory cell array for the purposes of test. Even though this definition was originally developed for testing, it will also be used for diagnosis. The memory arrays on this type of chip were not designed with the capability to test the three parts of the memory array separately (address decoder, read/write logic, memory cell array). Therefore, the memory array is essentially a black box whereby the only diagnostic information available is the requested address and the result of a read/write on this requested address, which is equivalent to saying that the only information available is the observation of the memory cell array. The job of diagnosis is to take this information and work backwards to figure out whether the fault occurred within the address decoder, memory cell array, or read/write logic and then specifically what happened. Therefore, the definition/model originally developed for testing, where all faults are modelled and observed as faults in the memory cell array is also a valid model for diagnosis. If a fault, regardless of whether it is in the address decoder, memory cell array, or read/ write logic, does not manifest itself as a fault or a set of faults in the memory cell array, it is not observable and, hence, not diagnosable.

Fault in the Memory Array

The five basic logical faults in the memory cell array are stuck-at faults, transition faults, coupling faults, non-deterministic faults, and destructive read faults. Most of these are well known, but the non-deterministic fault may need some further discussion.

There are two different cases of non-deterministic faults. In the first case, the state of a memory cell is completely non-deterministic. Stuck-open faults fall under this category. This means that the contents of the memory cell cannot be predicted ahead of time. Any read of a cell exhibiting this fault may be entirely random, may be always 0, or may always be 1. In the second case, the state of the memory is partially non-deterministic. In this case, under certain circumstances the memory cell behaves correctly and under other circumstances the memory cell becomes non-deterministic. For instance, writing a 1 into the memory cell will result in a 1 being read back out, but writing a 0 into the memory cell will result in an unpredictable result being read back out.

Figure 2A:
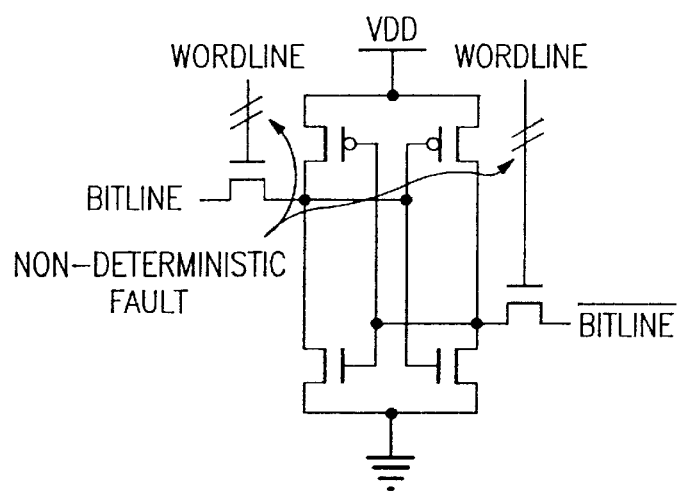
FIGS. 2A–2B illustrate examples of non-deterministic faults.
Figure 2B:
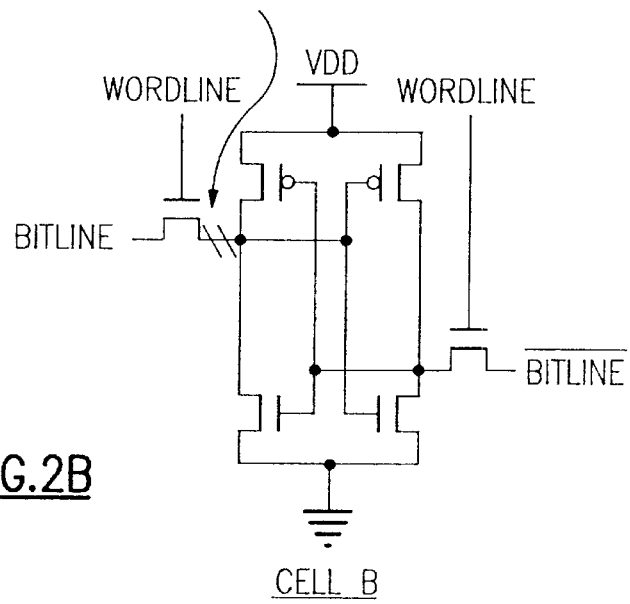

An example of how a regular non-deterministic fault can manifest itself is shown in FIG. 2A. The two breaks in the wordline will isolate the memory cell, rendering it inaccessible. The cell can be neither read from nor written to successfully. An example of a partially non-deterministic fault is shown in FIG. 2B. In this example, the true bitline has a break. However, the complement bitline is still operational, and the correct value can still be written into and read from that wire.

Figure 3A:
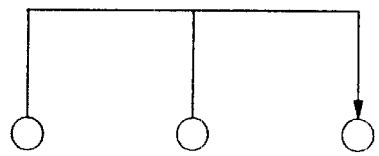
FIGS. 3A–3B illustrate examples of linked faults.
Figure 3B:
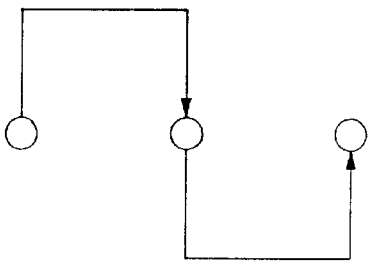
Figure 4:
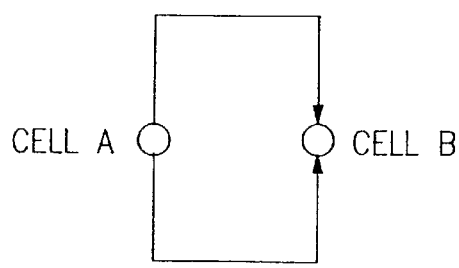
FIG. 4 illustrates an example of a state-coupling fault.

The present invention does not address all linked faults. A linked fault is a fault which influences the behavior of other faults. There are two types of linked faults. The first, illustrated in FIG. 3A, is where more than one fault affects the same cell. The second is where one fault can propagate to cause another fault, as illustrated in FIG. 3B. Including linked faults greatly increases the complexity of detecting and diagnosing for faults and, in general, will not be addressed except for one class of linked faults. These are state-coupling faults. The examples, shown in FIGS. 3A and 3B, all involve three cells. State-coupling faults are linked faults involving only two cells. This is a case where two faults exist which share the same source and target, as shown in FIG. 4. Writing both a 0 and a 1 to cell A forces a value into cell B.

Faults in the Read/Write Logic

The read/write logic is the model for the bitlines, sense amplifiers, bitline precharge logic, column mux, write buffers, and data out lines shown in the memory array of FIG. 1. The job of this logic is to write data into memory and to read data back out from memory.

The main idea in modelling the faults in this portion of the array is that while faults in the memory cell array will be manifested as individual memory cell faults, faults in the read/write logic will be manifested as a group of memory cell faults in a bit (i.e. a column of faults, a partial column of faults, or a group of columns of faults). A fault in a memory cell affects only that cell while a fault in the read/write logic will affect the group of memory cells that are connected to the faulty logic.

Figure 5:
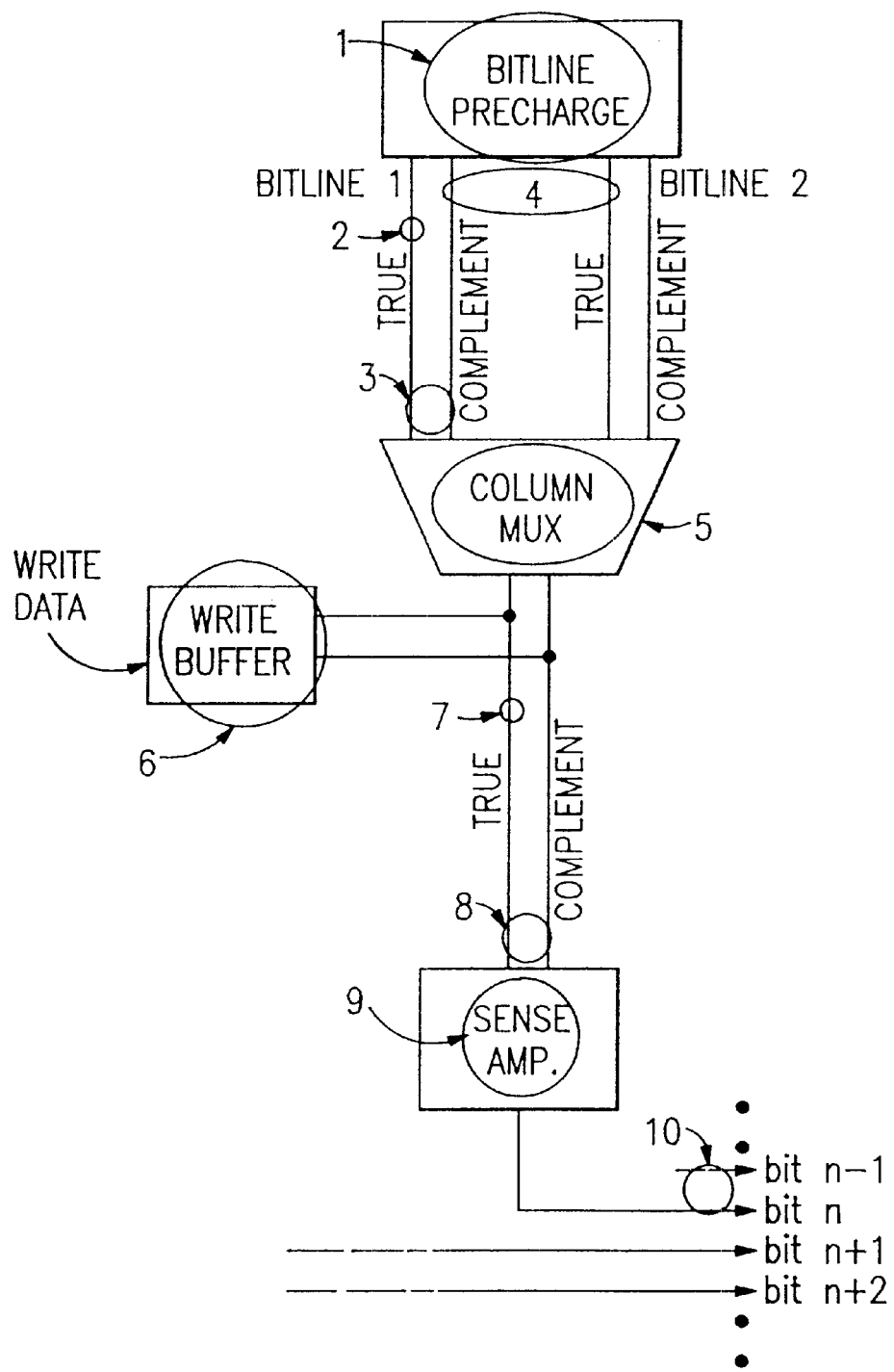
FIG. 5 illustrates an example of a read/write logic fault.

A general diagram of the read/write logic with the faults under consideration is shown in FIG. 5. The numbered circles represent the faults. Numbers 1 through 4 are bit-line or bit-line precharge faults, while numbers 7 through 10 are various types of output faults. #5 is a fault in the column select logic. This fault might have been considered as part of the address logic, but is discussed in this section since it is physically closer to the read/write logic.

An important concept is that of the scope of a fault. The scope of a fault is the set of memory cells that are influenced by that fault. For instance, a fault on bitline 1 (as in #2 and #3 in FIG. 5) will affect all the memory cells that lie along that bitline; therefore, the scope of this bitline 1 fault is the column of memory cells that lie along bitline 1. The scope of a sense amp fault are the two columns of memory cells that lie along bitline 1 and bitline 2. In general, the positioning of the sense amps, bitline precharge, column mux, and write buffer, as well as the level of multiplexing that occurs (and therefore the scope of faults in the mentioned components) varies upon implementation, but they are conceptually similar to the model presented here.

Though the individual memory cell faults that occur within the set of cells in the scope of the fault is dependent on the implementation, the idea that these faults will occur within a certain set of memory cells (the scope) is an important first step in diagnosis because it begins to narrow down the set of possible faults. The section on testing will then show how, by choosing the proper test patterns, the set of possible faults can be further narrowed down.

Faults in the Address Decoder

Figure 6:
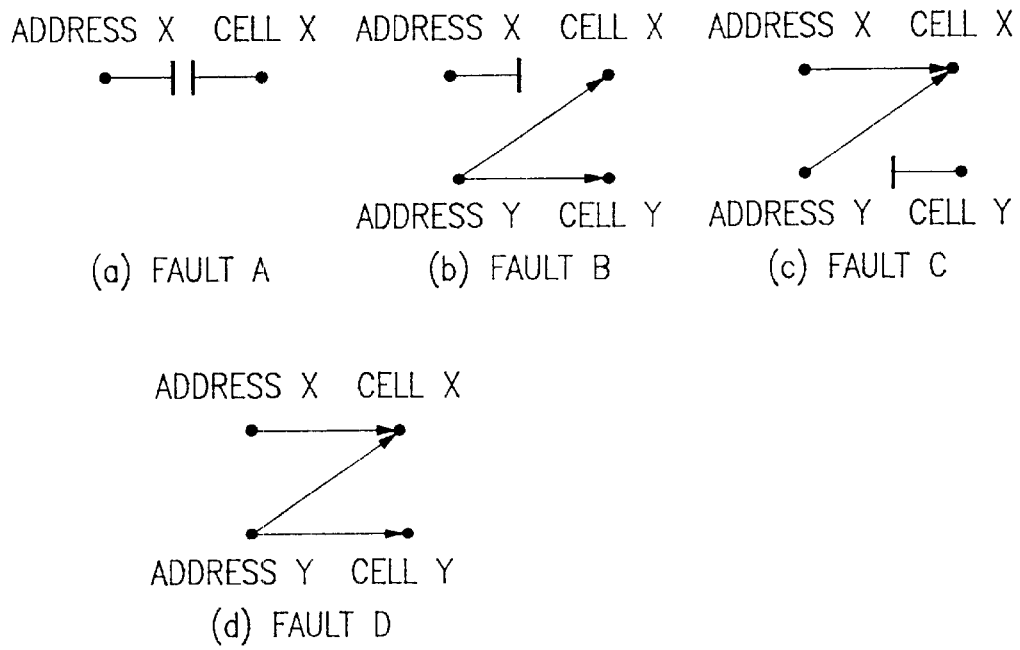
FIGS. 6a–d illustrate examples of logical address decoder faults.

The address decoder is the model for the row decoder, wordlines, bitlines, and column decoder (FIG. 1). The address decoder is responsible for translating the lower order bits of the address into a particular choice of a wordline (row decoder) and for translating the higher order bits of the address into a particular choice of a bitline (column decoder). In this fashion, for any bit of data, a unique memory cell is accessed for each address. Faults in the address decoder all involve incorrect mapping of addresses to memory cells. As illustrated in FIG. 6, there are four basic types of logical address decoder faults. However, real address decoder faults generally affect all memory cells along a particular wordline or bitline. Therefore, the "cell X (Y)" labels in FIG. 6 can be replaced with "wordline X (Y)" for row decoder faults and "bitline X (Y)" for column decoder faults. In reality, this is how the faults happen: an incorrect wordline or bitline is selected or the correct wordline or bitline is selected, but for the wrong address. This will cause all the cells along these wordlines or bitlines to appear faulty.

Figure 7:
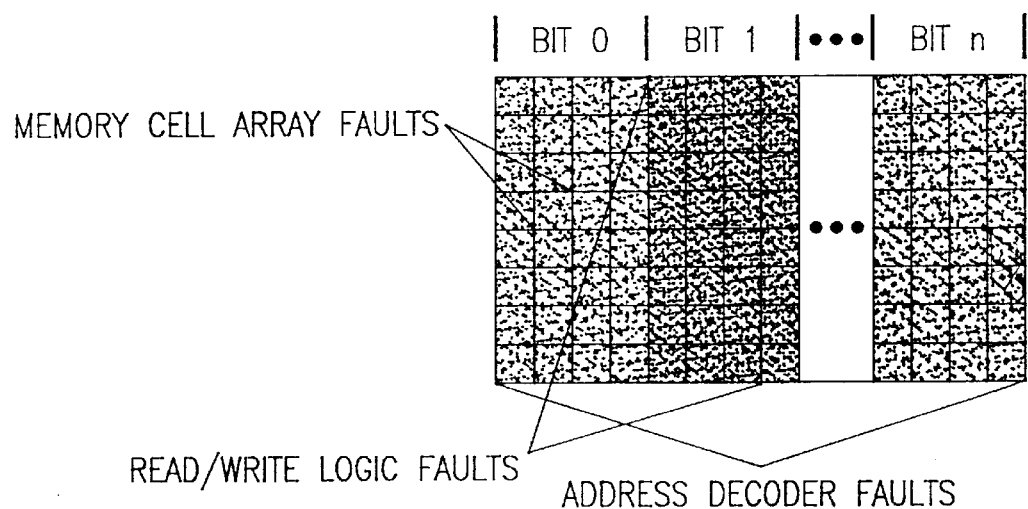
FIG. 7 illustrates a range of possible scopes of different faults.

In general, the address decoder logic is shared across many and sometimes all bits. The scope of address decoder faults can arise from the set of all memory cells, as shown in FIG. 7. This is not to say that the faults will exist everywhere, since an address decoder fault might result in a row of faults across all bits or it might result in a column of faults that exist in the first column of every bit.

Faults that are not Caught

There are some faults that are not considered in this fault model. They might not be caught and their diagnosis will not be described. A major group of faults that might not be caught are dynamic faults. These faults are time dependent and, though they will show up as functional faults, they cannot be described properly under the fault model presently outlined herein because these faults do not take timing into account. Examples of these types of faults are recovery faults, retention faults, and imbalance faults.

A second type of fault that is not caught is a coupling fault between different bits at the same address. In the memories presently considered herein, on a read of an address X an entire word of many bits is read out simultaneously. On a write of an address X, an entire word of many bits is written in simultaneously. The bits accessed by address X are accessed simultaneously, therefore, if coupling faults exist between these bits, then they may not be detectable. The bits may not be accessed at the same exact time and it might not be possible that the source cell for the coupling fault will be accessed before the target cell.

Test

The main test algorithm used herein was the unique address ripple word test. The diagnostic capabilities of this test are discussed in the following section. This section discusses some aspects of this test.

Every march test is composed of march elements. Each march element is composed of a series of operations that are done to every memory cell before proceeding to the next operation. These operations can be a combination of reading a 0 ("r0"), reading a 1 ("r1"), writing a 0 ("w0"), or writing a 1 ("w1"). Each march element can proceed in a forward direction (↑) through all the cells or in the reverse direction (↓).

Figures 8, 9:
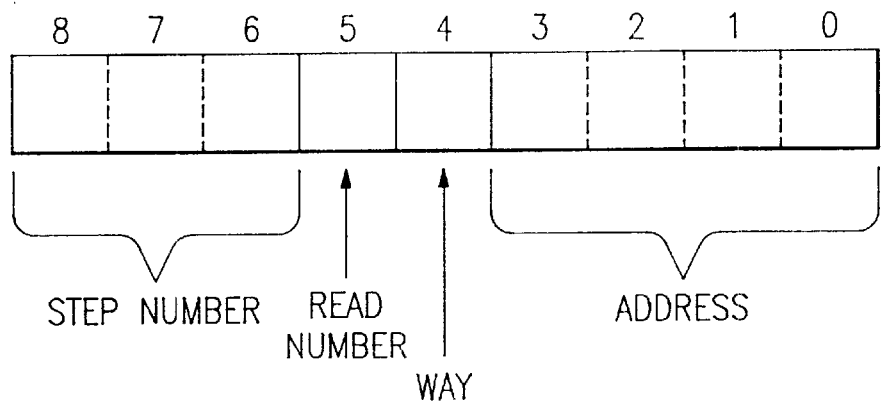
FIG. 8 illustrates a sample memory.
FIG. 9 illustrates information encoding using the present inventive method suitable for diagnosis.

Referring to FIG. 8, four bits from a sample memory are highlighted (shaded). This example figure will be used as the focus for the remainder of the discussion herein, unless otherwise noted. The example memory shown is for a two-way associative cache. Furthermore, each way is separated into low and high addresses. Low addresses run from 0 (bottom) to 7 (top) while high addresses run from 8 (bottom) to 15 (top). The individual memory cells are labelled with their respective addresses. The highest order bit of the address is used to select between the low and high addresses. The lower order three bits are used to select one of the eight rows.

Ideally, a march test would proceed through each of the individual addresses, one bit at a time. Practically, however, every bit in each address is accessed simultaneously. Memory is generally designed to retrieve a complete word from an address y (for example, a word at way B address 13 corresponds to the shaded boxes in the Figure), and therefore retrieves all bits simultaneously.

It is not important that march tests follow the numerical order of the addresses, just that march elements that go forward (↑) proceed in the opposite order from march elements that go backwards (↓). For this embodiment, a march element that goes forward (↑) starts at the lower left corner of each bit, address 8 of way A high, works up the way A high column to address 15, then jumps to address 0 of way A low and works up the way A low column to address 7. The test then proceeds in a similar manner up the way B high column and finally up the way B low column. The last memory cell addressed going forward (↑) is the top cell in way B low, address 7. A march element going in the backwards (↓) direction goes in the reverse order, starting from the top cell of way B low (address 7), working down the way B low column, down the way B high column, down the way A low column, and finally down the way A high column. The last memory cell addressed going backwards (↓) is the bottom cell of way A high (address 8).

The unique address ripple word test's algorithm is presented in Table 1 below. Each of the numbered steps correspond to a march element. For example, in step 3, this element proceeds in a forward (↑) direction through each address. All the cells at each address (remembering that the same address of every bit is accessed simultaneously) is read (with a value of 1 expected), written with a 0, read again (with a value of 0 expected), and finally written with another 0. Once these four operations have finished, the test proceeds to the next address (in ↑ order).

TABLE 1

1. ↑w0
2. ↑r0w1r1w1
3. ↑r1w0r0w0
4. ↑r0
5. ↓w1
6. ↓r1w0r0w0

TABLE 1-continued

7. ↓r0w1r1w1
8. ↓r1

March tests can be used, not just to catch faults, but to diagnose faults. This is accomplished by examining the fault signature of a fault due to the march tests. Fault signatures will be described in more detail in the next section. In order for the tests to support diagnosis, the results of the tests have to be observable. This observability requirement translates into some requirements for implementing the tests.

A thorough diagnosis cannot occur unless all the results of the tests are observable; the test must generate a complete picture of what is happening internally. It will be shown in the next section that it suffices to know what bit(s) fail and at what point during the test (steps 2, 3, 4, 6, 7, or 8; which reads in steps 2, 3, 6, and 7; etc.). As the test marches through the addresses writing and reading data, the results of each read must be output to the pins of the chip, where it can be monitored off-chip. Furthermore, tests written for diagnosis cannot merely halt once an incorrect value is read from memory. These tests need to continue to run in order to present a complete picture of what is happening in the memory.

One potential flaw with standard array tests executed by the processor on its own arrays is that the processor gets involved in detecting faults, and branches to some error indication code when a fault is detected. This is fine for go/no-go testing, but makes diagnosis difficult. To clarify, the actual test generation process will be described below.

To generate tester patterns, the test (a program) is simulated on a "good" model of the chip. The bus traces from this simulation are used by the tester as the signals it applies to and as the signals it expects from the chip. Therefore, if the program branches to X on the "good" model, the tester will supply signals to the chip as if a branch to X occurred, even when the program as executed on the actual processor branches to Y because of a fault in the chip. As a result, the tester will continuously flag mismatches after the first fail, even though these mismatches are trivial and have no diagnostic content. This is adequate for go/no-go testing where on the first unsuccessfully branch on the chip, the tester will report a mismatch and stop. However, for diagnosis, further information is needed from the rest of the memory array in order to build a complete failure map of the memory.

The tests used in the present invention were written such that regardless of the number of fails, the code does the same thing. This is guaranteed if the code is branch-free: every read of a memory cell is presented to the output pins as a write to main memory. No comparison is ever done during this step, regardless of whether the program is reading a 0 or a 1 from a memory cell. The output is presented to the bus without any decision-making on the part of the program as to whether the value read is correct or incorrect.

In addition, the tests have to provide a unique label for each read in order to identify what address has been read and what step of the test is being performed. Note that one way of doing this is by keeping track of which clock cycle corresponds to which address of which step of the test. However, this is complex. An easier solution is to present this information to the output pins of the chip as a tag along with the results of the read.

To facilitate diagnosis, the memory cell being read and the step number are encoded in the address of this write to main memory. This information will therefore appear off-chip as a memory request that the tester can monitor. For instance, for the two way, 16 address memory shown in FIG. 8, this information can be encoded as shown in FIG. 9. Referring to FIG. 9, Bits 8:6 provide information about which step of the test is being performed. Bit 5 is the read number (the first or second read of the step given by bits 8:6). Bit 4 is the way. Bits 3:0 are the address (from 0 to 15).

Figure 22:
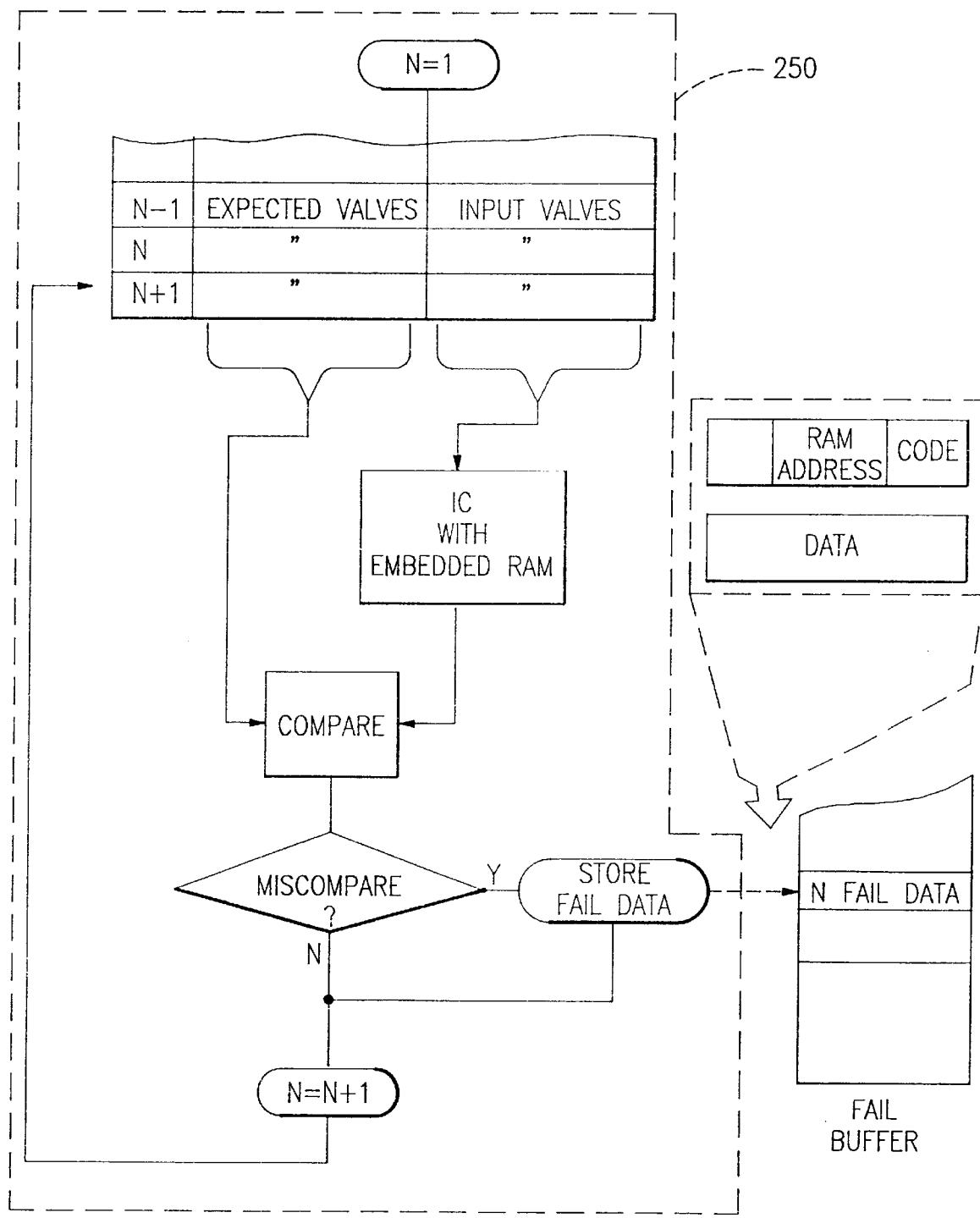
FIG. 22 illustrates an overall flowchart of the present inventive method.

As an overall description, referring to FIG. 22, shown therein is an overall flowchart of the test pattern application conducted by the tester 250. Prior to this tester stage, an architectural verification pattern ("AVP") is written in assembly code specifically for the particular IC under test and for each embedded memory to be accessed therein. The AVP is loaded into the processor and executed, thereby accessing targeted embedded memories within the processor chip and applying input test values (top of FIG. 22) to be stored in the memories. The AVP includes output commands for the processor to output over the IC output pins the stored values from the memories. These actual IC output values are then compared with expected values. The expected values are generated by a simulation run prior to the tester stage by running the AVP on an IC simulator. This simulation provides a database of "good" (i.e. expected) input/output data for use in the comparing step. Such a simulator is a well known article of commerce, such as the V-System/VHDL for Workstation, of Model Technologies, Inc. of Beaverton, Oreg., and is not described further. Typically, as another step prior to the tester step, a translator takes the simulator output pattern (i.e. the input/output data) and provides a translated tester-specific version suitable for use by the tester 250 on the particular IC under test. The tester then applies the translated version to the IC inputs pins. A translator, such as the TDS (Test Development Series) from Summit Design, Inc., Wilmington, Vt. 05363, also is a well known article of commerce, and is not described further. Another well know article of commerce is the tester itself, for example, the Teradyne model J971 or J921, available from Teradyne, Inc., 321 Harrison Ave., Boston, Mass. 02118, and is not described further.

As illustrated at the top of FIG. 22, the input data includes input values and expected values. The embedded RAM is accessed by executing the AVP in the processor as explained above, which AVP is loaded into the processor through the input pins and includes the input data values that are stored in the embedded memory. Upon execution of the output commands (also included in the AVP) the memory stored values are intercepted at the IC output pins and are compared with the expected values. For each occurrence of a miscompare in the comparing step, fail data is sent to a fail buffer for later diagnosis, as explained previously. The fail data includes information about which bits failed and which test pattern caused the fail, and is included in the data intercepted at the IC's output pins. Each positive compare in the comparing step does not generate fail data and the test proceeds to the next increment.

An example assembly code AVP is shown in Appendix A. A self-explanatory pseudocode version is shown below in Table 2. Referring to Table 2, the pseudocode illustrates the consecutive steps of writing then reading zeroes followed by writing and reading ones to all the RAM addresses. The information pertaining to identification of the erroneous bit and of the portion of the test pattern causing the erroneous output is obtained by adding a code (which identifies the testing step) and storing the RAM address in register B. The move commands output register A and B data over the IC output pins where they are intercepted by the tester. At this point, the comparing step is performed and the fail information from registers A and B is stored for diagnostic analysis.

TABLE 2

```
code = 0
do all RAM addresses
   write word of all 0s to RAM address
end
do all RAM addresses
   read word from RAM address and store in register A
   put RAM address in register B
   shift contents of register B to the left by 1 bit
   add code to contents of register B
   move contents of register A to address stored in register B
end
code = 1
do all RAM addresses
   write word of all 1s to RAM address
end
do all RAM addresses
   read word from RAM address and store in register A
   put RAM address in register B
   shift contents of register B to the left by 1 bit
   add code to contents of register B
   move contents of register A to address stored in register B
end
```

Referring to the AVP in Appendix A, the assembly code program has been labelled in ten sections. Sections 1–4 define read/write macros rdline, wrline, wr10, and wr11, for accessing a particular processor cache memory. Sections 5 and 10, i.e. epilogue and prologue, respectively, are IC specific and are used for initializing and clearing the processor before and after test, respectively. Sections 6–9 perform the march algorithm by writing and reading data from all memory locations. In particular, section 6 incrementally writes zeroes to the even words and ones to the odd words. Section 7 reads back the data written in section 6. Section 8 incrementally writes ones to the even words and zeroes to the odd words of the memory. Section 9 reads out the data written to the memory in section 8.

The pertinent commands which send fail information to the IC output pins for identifying which bit and test pattern caused a failure (i.e. a miscompare) are shown in the rdline macro of section 1, and are as follows: (1) mov ecx,ebx— moves an address of the read data to ecx; (2) or ecx, code—inserts test pattern information (code) to ecx; and (3) mov [ecx],eax—commands the processor to store eax (read memory value) to the secondary memory address specified by the data [ecx]. The processor executes the store command (3) by sending the eax and [ecx] data over its corresponding output pins where it is intercepted by the tester. The value in eax is used for the compare while ecx contains RAM address data and test step data. The tester proceeds with the compare step by comparing the eax value with the expected value. At each miscompare, eax and ecx are both stored in the fail buffer to provide the necessary data for diagnostic analysis.

Diagnosis

The goal of diagnosis is to discover the reason behind a system misbehavior: where did the fault occur and why. This section describes both what tests catch the faults and how these faults manifest themselves in these tests. The manifestation is referred to as a fault signature. The two components of a fault signature are the locations in the test where the fault manifests itself (e.g. reading the wrong value in the first read of step 2) and the locations in memory where the fault manifests itself (e.g. all cells of way A of bit 3). If different faults can be shown to have different fault signatures (i.e. manifest themselves differently), then knowing each fault's fault signature is all that is required to diagnose that fault. Once these fault signatures have been understood and catalogued, a decision making procedure can be created to make a diagnosis based upon the fault signature. In the present method, we assume that faults occur singly. The case where multiple faults occur in the same memory array adds extra complexity to both test and diagnosis and will not be considered here.

Note that diagnosis assumes that the modeled faults are the only ones that can exist. The goal is to attribute a different fault signature to each fault. However, there is a danger that an unlisted fault exists which manifests itself with the same fault signature as one of the listed faults. For test, an unknown fault is not a problem so long as this fault can be caught with the existing test. For diagnosis, an unknown fault is a problem because it may potentially have the same fault signature as a known fault, causing an incorrect diagnosis. For a full background of the diagnostic analysis, the reader is directed to consult *Test and Diagnosis of Microprocessor Memory Arrays Using Functional Patterns*, by Ya-Chieh Lai, Massachusetts Institute of Technology, Cambridge, Mass., 1996.

Fault Detection and Manifestation in a Memory Cell Array

There are five types of memory cell faults: stuck-at faults, transition faults, coupling faults, non-deterministic faults, and destructive read faults. As mentioned in section 2, the scope of these types of fault is just a single cell—all these faults manifest themselves as single cell fails. As an example, we will describe the stuck-at faults and the coupling faults.

In the case of stuck-at faults the tests only need to be written such that a value of both 1 and 0 are written to and read from each cell. A unique address ripple word test is adequate to test for all stuck-at faults. The reads (r1) in Table 3a and (r0) in Table 3b are where mismatches occur for these tests in the event of a stuck-at 0 and a stuck-at 1 fault respectively. The scope of this fault is a single cell.

TABLE 3

Stuck-at fault detection and manifestation

| | |
|---|---|
| 1. ↑w0 | 1. ↑w0 |
| 2. ↑r0w1r1w1 | 2. ↑r0w1r1w1 |
| 3. ↑r1w0r0w0 | 3. ↑r1w0r0w0 |
| 4. ↑r0 | 4. ↑r0 |
| 5. ↓w1 | 5. ↓w1 |
| 6. ↓r1w0r0w0 | 6. ↓r1w0r0w0 |
| 7. ↓r0w1r1w1 | 7. ↓r0w1r1w1 |
| 8. ↓r1 | 8. ↓r1 |
| (a) S-a-0: All attempts to read 1 will fail | (b) S-a-1: All attempts to read 0 will fail |

Three types of coupling faults are being targeted: idempotent coupling faults, inversion coupling faults, and state-coupling faults. Certain patterns in the test can be used to expose these coupling faults. The source cell which causes the fault can be triggered by writing a 1 or a 0. Furthermore, triggering the fault in both the case when a 1 is expected and when a 0 is expected will catch all coupling faults.

There are thus four different combinations of triggers and expected values. The initial assumption is that the source cell precedes the target cell. FIG. 10A shows how a test can be written such that the combinations of triggers and expected values can arise. The two columns on the left show the combination of trigger and expected value. The columns on the right show the two steps necessary to achieve this combination. If the target cell precedes the source cell, FIG. 10A shows how the tests can be written to expose the four combinations of triggers and expected values.

Failures due to the three coupling faults can be thought of as failures in some set of these combinations. As the simplest case, consider an idempotent fault where writing a 1 in one cell forces a 0 in another cell. This fault can be caught with a test in which there is a trigger of 1 at the source and the expected value of 1 at the target. Each of the four types of idempotent faults have a corresponding test that will expose it:

1. writing a 1 in the source cell forces a 0 in the target cell: trigger of 1 in source, expect a 1 in target
2. writing a 1 in the source cell forces a 1 in the target cell: trigger of 1 in source, expect a 0 in target
3. writing a 0 in the source cell forces a 0 in the target cell: trigger of 0 in source, expect a 1 in target
4. writing a 0 in the source cell forces a 1 in the target cell: trigger of 0 in source, expect a 0 in target A similar correspondence can be made for inversion faults. Consider the case where writing a 1 in one cell inverts the state of another cell. It is necessary to check that writing a 1 in the first cells flips the target cell both when a 1 is expected and when a 0 is expected. If an incorrect value is read in both cases, then the cell exhibits an inversion fault.

There are two types of state-coupling faults. In the first type, writing a value, x, in the source cell will force a second, target, cell to this same value, x. In the second type, writing a value, x, in the source cell will force a second, target, cell to its opposite binary value. To catch the first type of state-coupling fault, it is necessary to both write a 1 to the source cell while expecting a 0 in the target cell and write a 0 to the source cell while expecting a 1. An incorrect value should be read from the target cell in both cases for this type of state-coupling fault.

The unique address ripple word test contains all the necessary components as shown in FIGS. 10A and B. Therefore, this test will be able to catch these three types of coupling faults both when the target cell precedes and follows the source cell of the fault. Furthermore, because these three types of coupling faults are caught with different combinations of triggers and expected values, they can be uniquely diagnosed. FIG. 11 shows the fault signature in the unique address ripple word test in the case of the four types of idempotent faults. The circled reads are the reads in the test where a mismatch will occur if an idempotent fault exists. Note that this test can identify the faulty pair, but not which cell caused the fail and which manifests it.

FIG. 12 shows the unique address ripple word test with symptoms of the inversion faults. Again, the circled reads indicate where an incorrect value is read. Finally, FIG. 13 shows this test exhibiting the fault signatures of state-coupling faults.

As with the other memory cell array faults, coupling faults all manifests themselves as single cell fails. The main idea of FIGS. 11 through 13 is that each of the three coupling faults (idempotent, inversion, state-coupling) have different fault signatures. This allows them to be distinguished from each other and, thus, diagnosed.

Fault Detection and Manifestation in the Address Decoder

Three types of address decoder faults have been described: row decoder faults, column decoder faults, and wordline/bitline selector faults. Each of these faults have their own fault signatures. As mentioned previously, both the row decoder and column decoder faults can be further classified into four types of possible addressing faults. Note that although FIG. 6 seems to indicate an address X that activates wordline X (or bitline selector X), in reality there are a set of addresses which all activate wordline X (or bitline selector X). "Address X" is merely a convenient shorthand for all addresses that access wordline X (or bitline selector X). For instance, in FIG. 14, if the cells that are shaded are accessed by wordline X, then the set of cells "address X" which activate wordline X are cells 2 and 10 for all bits and for both way A and way B.

Figures 14, 15:
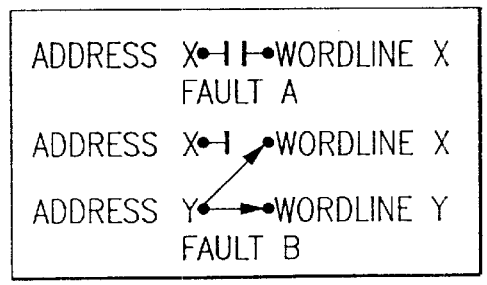
FIG. 14 illustrates an addressing clarification.
FIGS. 15–17 illustrate fault signatures of row decoder faults.

This section will show how each of these four addressing faults manifest themselves for the row decoder and column decoder and how they can be caught. Referring to FIG. 6, the result of faults A and B is that a row of memory cells will become inaccessible (therefore non-deterministic). Any attempt to write to or read from an any address X that is supposed to activate wordline X will fail. All addresses for all memory cells that should have been accessed with this wordline wire are never accessed. The result is that these two faults manifest themselves as shown in FIG. 15. Any test that can catch non-deterministic faults as described above can catch these faults.

Figure 16:
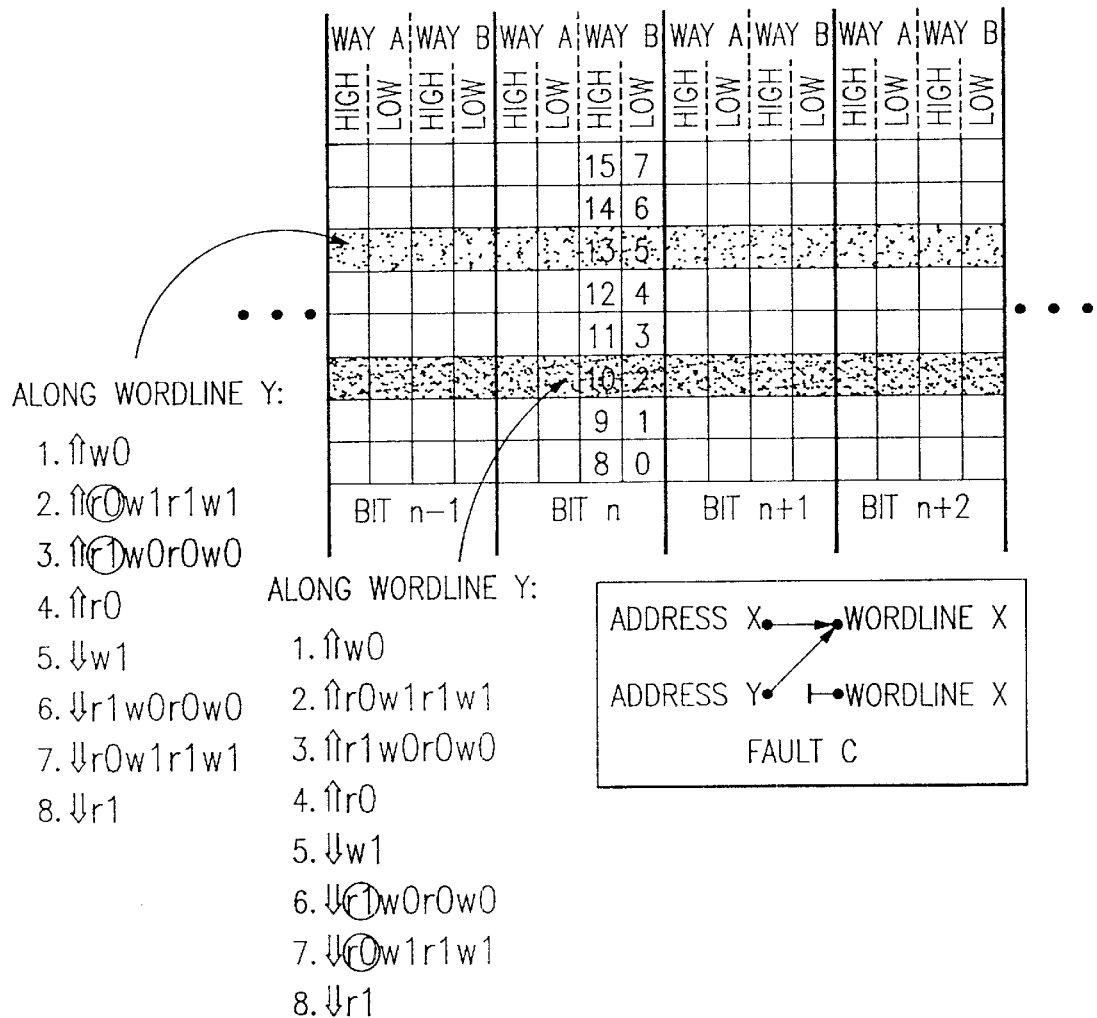

A row decoder with fault C is different. Referring back to FIG. 6, while in fault A and B there exists a certain address X for which none of the wordline wires fire, in fault C there exists a certain address Y for which an incorrect wordline is fired. Two addresses end up activating the same wordline. Writes to addresses that are accessed by wordline X show up on reads from addresses that are accessed by wordline Y and vice versa; addresses accessed by wordline X appear to be state-coupled to addresses accessed by wordline Y and vice versa. The signature that results from performing a unique address ripple word test on a memory with this type of fault is shown in FIG. 16. In bit n way B, address 2 is bilaterally state-coupled to address 5 while address 10 is bilaterally state-coupled to address 13. This is true in all ways of all bits all along wordline X and wordline Y. The parts of the test that are circled in FIG. 16 are the reads from memory where an incorrect value is read. Any test that can catch state-coupling faults as described above can catch this fault.

Figure 17:
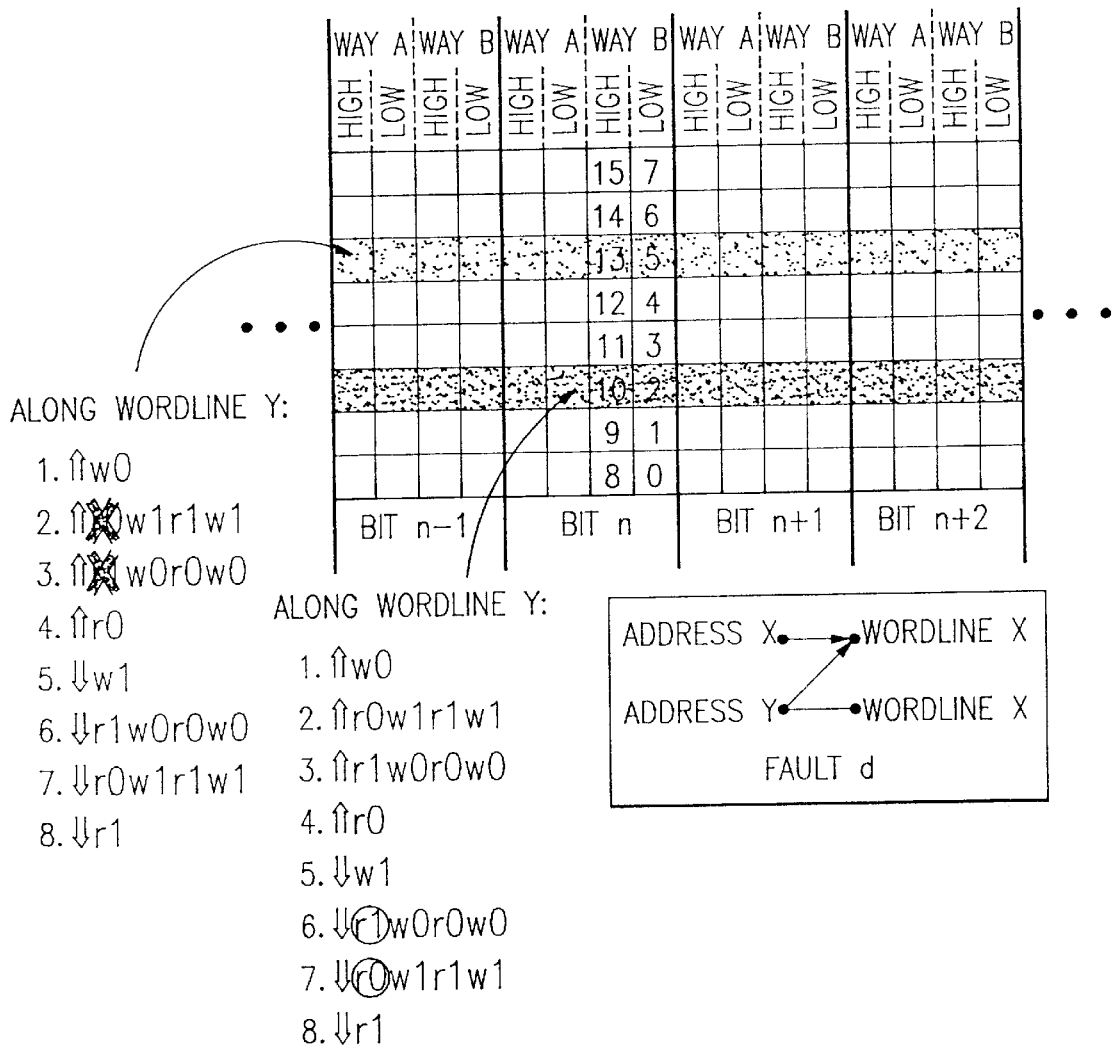

In fault D (FIG. 17), wordline X is activated by both address X and address Y. Like fault C, this results in a state-coupling fault: the cells accessed by address X will have a state-coupling fault. However, accessing address Y activates wordline Y as well as wordline X. The result is that when cell X and cell Y are at different values, the cells that are accessed by address Y are partially non-deterministic. An attempt to read cell Y at this point will also read cell X. FIG. 17 shows the fault signature for fault D in the row decoder under a unique address ripple word test. In way A of bit n+1, addresses 2 and 10 have state-coupling faults while addresses 5 and 13 have partially non-deterministic faults. This fault is replicated across both ways of all bits. The circled parts of the test indicate the locations where an incorrect value is read out. This is an example of a state-coupling fault. The crossed out parts of the test indicate the locations where a non-deterministic value may be read. A test that can catch state-coupling faults and non-deterministic faults as described above can catch this fault.

Reducing Test Time and Test Size

The tests described herein are functional tests. They run on the microprocessor as assembly programs (see appendices A and B). Most of these tests are march tests and their length is dependent on the number of memory cells that the test must march through. These tests can become rather large and the amount of time required to simulate and run these tests as well as the amount of tester buffer memory required to store these tests can be enormous.

The amount of time required to simulate these tests is important because all the assembly programs need to be simulated in order to generate the patterns that the tester applies to the processor. The amount of time required to run these tests is important because during manufacturing the test patterns need to be applied to every processor and so any decrease in test run time increases the throughput for the manufacture of the processors. The amount of tester buffer required is important because there is only a limited amount of tester buffer memory available in the test equipment and buying extra memory is either costly or not possible.

Reducing the Simulation Time

Two strategies to reduce the simulation time were considered. The first was to split the unique address ripple word test into four parts. The second was to mimic the memory being broken into parts and to simulate the tests on the separate parts. In this way, though the total simulation time may be unchanged or longer, each of these parts is independent; therefore, many parts can be simulated in parallel.

Figure 18:
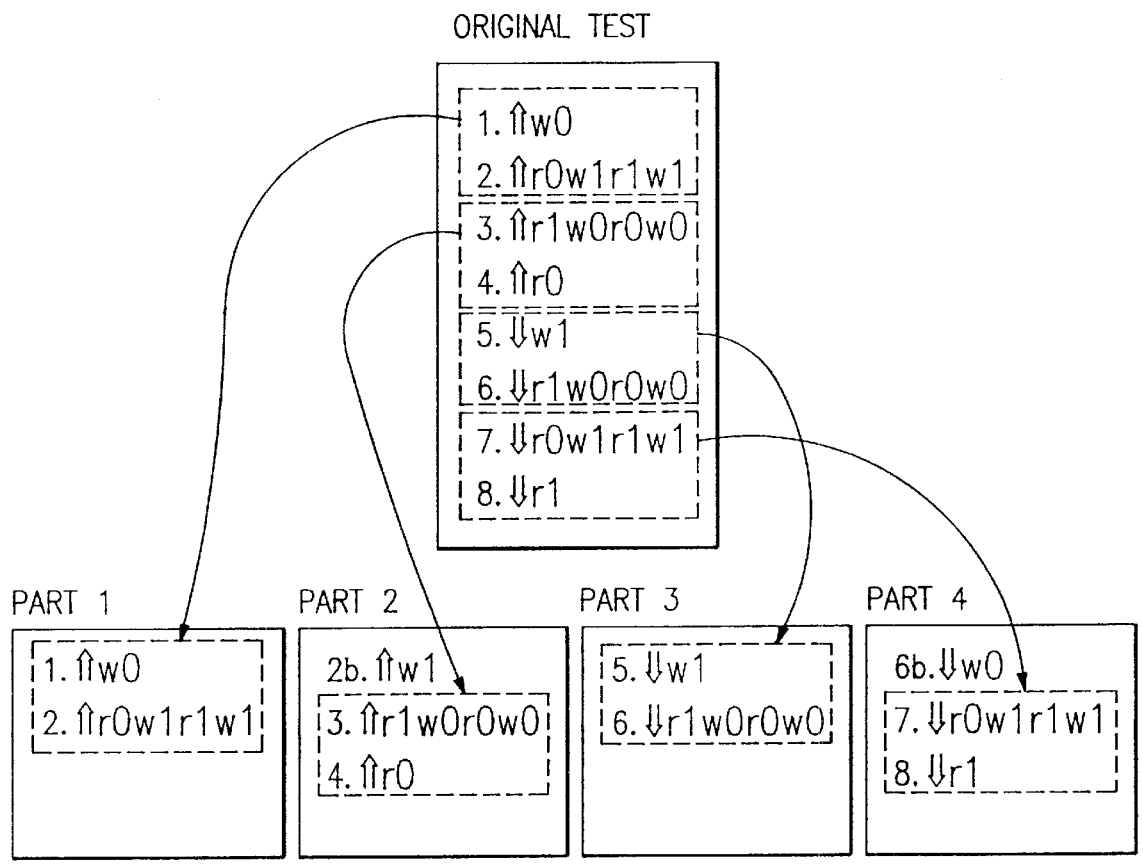
FIG. 18 illustrates breaking up the unique address ripple word test.

The unique address ripple word test can easily be broken into four parts without loss of diagnostic capability as shown in FIG. 18. Notice how in part 2 and part 4, steps 2b and 6b have been added, respectively. These two extra steps are necessary to continue to trigger all the appropriate coupling faults All four parts need to be run in order to perform diagnostic analysis. Their results can be put together to generate a complete failure bitmap with the result that diagnosis can proceed as before. Notice that only the simulation time for each part has been shortened. The amount of tester buffer memory required and the total simulation and run time of all four parts has been increased due to the two extra steps, 2b and 6b.

A second method of shortening the amount of simulation time was to divide the memory and simulate the tests on each piece separately (each piece being a certain set of addresses). However, the memory cannot be broken up haphazardly, because both test and diagnosis will be affected.

The memory cannot be broken into pieces as shown in FIG. 19a. In this case, the test is run separately on the top half and the bottom half. The problem is that not all coupling faults will be caught. For example, in FIG. 19a, a coupling fault between memory cell X and memory cell Y will never be caught. The source that triggers the fault and the target of the fault are in different parts. Assuming that coupling faults only occur between adjacent memory cells (otherwise, breaking memory into pieces will not work at all), the first rule is that adjoining pieces must overlap; the memory cells at the boundary between any two pieces must be a part of both pieces. This is illustrated in FIG. 19b, in which case the darker row is tested as part of both the top piece (part 1) and the bottom piece (part 2). Coupling faults between memory cell X in FIG. 4.2b and memory cells both above and below it will be caught.

Figures 20, 21:
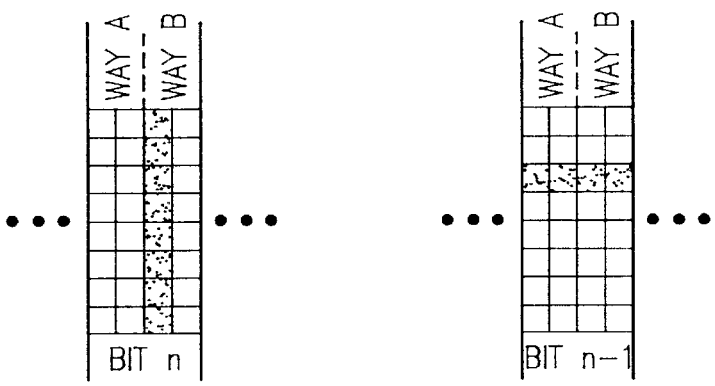
FIG. 20 illustrates catching a row decoder fault.
FIG. 21 illustrates catching a column decoder fault.

The second rule is that regardless of how many smaller pieces the memory is broken into, there needs to be a piece where all the wordlines are accessed in order to test for row decoder faults. For instance, in addition to the two pieces shown in FIG. 19b, there needs to be a third piece as shown in FIG. 20 where every one of the wordlines is accessed.

An analogous rule is that a piece must exist where all the bitline selectors are accessed so that column decoder faults can be caught, which is already true in FIG. 19b. In general, there needs to be a piece as shown in FIG. 21 where every one of the bitline selectors is accessed.

As with breaking up the unique address ripple word test, breaking up memory only decreases the simulation time. It increases both the run time and the required tester buffer memory because of the redundant testing of certain memory cells (i.e. the overlapped memory cells, or testing the same memory cells to account for row decoder or column decoder faults).

Reducing the Tester Buffer Memory Requirements

Two strategies were pursued to reduce the tester buffer memory requirements. The first was to turn on the microprocessor's instruction cache during these tests. The second was to compress the data in the tester memory.

The assembly code for the memory array tests are not very long. These tests are written as iterative loops that increment or decrement through memory. Part of the reason for the huge tester memory requirements is that the tester is constantly feeding the processor with the next instruction. With the cache disabled, the tester needs to continuously supply the next instruction to the processor. The looping nature of the code means that the same instruction will be repeatedly supplied by the tester for each iteration of the loop. With the cache enabled, only the first iteration of the loop needs to be supplied to the processor where it can be cached. Typically a factor 2 reduction in test data volume was obtained by turning on the caches. Note that this method only provides savings in the amount of tester buffer memory required. It does not affect the amount of time it takes for the tests to run or to simulate.

It is important to realize that the instruction cache was loaded using the normal caching mechanisms. No preloading of the cache using some scan technique was done. This approach is therefore applicable also to processors that have only partial scan, or no scan at all.

Once cached, the tester is often idle, supplying the same information to the processor every clock cycle; turning on the cache allows the processor to do a lot of work without needing information from the bus. Instead of having the tester supply the same exact information each clock cycle, this information can be compressed into one line along with a repeat value that tells the tester how many times to repeat it. This compression is the second method of addressing the tester buffer memory requirements. This compression typically reduces the number of test vectors that have to be stored in the tester by about a factor 10. As with enabling the cache, the savings here are only in terms of the amount of required tester buffer memory. The time required to run and simulate remain the same.

Alternative Embodiments

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

APPENDIX A

```
;------------------------------------------
; Various useful equates
;------------------------------------------
tphigh0     EQU         3e0h
btlow0      EQU         000h
wrwaya0     EQU         00ah
wrwayb0     EQU         80ah
rdwaya0     EQU         006h
rdwayb0     EQU         406h
invsp5      EQU         1e0h
invwrd      EQU         0fffffc1fh
;------------------------------------------
; Macro to write to and read from special registers
;------------------------------------------
wrmsr       macro
            db    0Fh, 30h
            endm
rdmsr       macro
            db    0Fh, 32h
            endm
; read a sbac line
rdline      macro       reg5, code
            mov         eax,ebx                 ;word address
            mov         ecx,20D9h               ;spec0
            wrmsr
            mov         eax,reg5                ;read command and way select
            mov         ecx,20DBh               ;spec5
            wrmsr
            mov         ecx,20D3h               ;spec4
            rdmsr
            mov         ecx,ebx                 ;initialize the address that will contain
                                                ;the diagnostic code
            and         ecx,0200h               ;mask all but high/low bit
            shl         ecx,1                   ;get high/low bit in right position
            mov         esi,ebx                 ;
            and         esi,01e0h               ;mask all but (high or low) address
            shr         esi,1                   ;get address in right position
            or          ecx,esi                 ;recombine address with high/low bit
            or          ecx,code                ;add other code
            mov         [ecx],eax               ;send data to coded address
            endm
; write to a sbac line
wrline      macro       reg5
            mov         eax,ebx                 ;word address, tag and offset
            mov         ecx,20DDh               ;spec1
            wrmsr
            mov         eax,reg5                ;other bits and write command
            mov         ecx,20DBh               ;spec5
            wrmsr
            endm
; write a 0 to a sbac line
wr10        macro       reg5
            mov         eax,ebx                 ;word address, tag and offset
            and         eax,0000003e0h          ;set 0's to all but word address
            mov         ecx,20DDh               ;spec1
            wrmsr
            mov         eax,reg5                ;other bits and write command
            and         eax,0fffffe1fh          ;set 0's to other bits
            mov         ecx,20DBh               ;spec5
            wrmsr
            endm
; write a 1 to a sbac line
wr11        macro       reg5
            mov         eax,ebx                 ;word address, tag and offset
            or          eax,invwrd              ;set 1's to all but word address
            mov         ecx,20DDh               ;spec1
            wrmsr
            mov         eax,reg5                ;other bits and write command
            or          eax,invsp5              ;set 1's to other bits
            mov         ecx,20DBh               ;spec5
            wrmsr
            endm
;------------------------------------------
; Data segment definitions
;------------------------------------------
segdata segment para public use16 'data'
segdata ends
;------------------------------------------
```

APPENDIX A-continued

```
; AVP Code Segment
; ----------------------------------------------------
                public          entry16
                public          realstart
segr            segment para public use16 'code'
                assume cs:segr, ds:segdata
entry16:
realstart:
;disable the sbac and the btac
                mov             eax,0000000bh
                mov             ecx,00002061h           ;pscr0
                wrmsr
;make modifications to the CR0 register
;   CD = 0 , enables the internal cache fill mechanism
;   NW = 0 , enables writethroughs and cache invalidation cycles
                mov             ecx,cr0
                and             ecx,09ffffffh           ; clear bits 29 and 30 (NW and CD)
                mov             cr0,ecx                 ; do change
;write 0's to the even words and 1's to the odd words in increment order
                mov             edx,wrwaya0             ;write to way a
10:             mov             ebx,btlow0              ;lowest address
11:             wrline          edx                     ;0's to the even word
                add             ebx,20h                 ;increment to odd address
                wrl1            edx                     ;1's to odd word
                add             ebx,20h                 ;increment address to next even word
                cmp             ebx,tphigh0             ;last even high address?
                jbe             11
                cmp             edx,wrwayb0
                je              nxt1
                mov             edx,wrwayb0             ;write to way b
                jmp             10
;read back 0's from even words, 1's from odd words in increment order
nxt1:           mov             edx,rdwaya0             ;read way a
                mov             ebp,0a000h              ;start code register
16:             mov             ebx,btlow0              ;lowest address
17:             rdline          edx, ebp
                add             ebx,20h                 ;increment to next address
                cmp             ebx,tphigh0             ;last high word
                jbe             17
                cmp             edx,rdwayb0
                je              nxt2
                mov             edx,rdwayb0             ;read way b
                mov             ebp,0a800h              ;restart code register
                jmp             16
;increment write 1's to the even words and 0's to the odd words
nxt2:           mov             edx,wrwaya0             ;write to way a
13:             mov             ebx,btlow0              ;lowest address
14:             wrl1            edx                     ;1's to even word
                add             ebx,20h                 ;increment to odd
                wrl0            edx                     ;0's to odd word
                add             ebx,20h                 ;increment address to next even word
                cmp             ebx,tphigh0             ;last high address
                jbe             14
                cmp             edx,wrwayb0
                je              nxt3
                mov             edx,wrwayb0             ;write to way b
                jmp             13
;read back 1's from even words, 0's from odd words in increment order
nxt3:           mov             edx,rdwaya0             ;read way a
                mov             ebp,0c000h              ;start code register
19:             mov             ebx,btlow0              ;lowest address
110:            rdline          edx,ebp
                add             ebx,20h                 ;increment to next address
                cmp             ebx,tphigh0             ;last high address
                jbe             110
                cmp             edx,rdwayb0
                je              done
                mov             edx,rdwayb0             ;repeat for way b
                mov             ebp,0c800h              ;start code register
                jmp             19
done:
                mov             ecx,0h                  ;clear ecx before exit
notok:
                nop
                nop
                nop
                hlt
                nop
                nop
```

APPENDIX A-continued

```
            nop
            nop
            nop
            nop
            nop
            nop
            nop
            nop
            nop
            nop
            nop
            nop
            nop
            nop
            nop
            nop
            nop
segr        ends
segrz       segment para public use16 'code'
            dd              00F4F400H
segrz       ends
            end
```

What is claimed is:

1. A method comprising the steps of:

a) exercising an embedded memory, including writing to at least a plurality of memory locations in the embedded memory test data followed by reading data from said at least a plurality of memory locations, said writing and reading steps each including a plurality of operations;

b) simulating the exercising step to generate expected test read data;

c) comparing the data read from the embedded memory with the expected test read data;

d) providing miscompare data at each occurrence of a miscompare during the comparing step, the miscompare data including at least one location address of said at least a plurality of memory locations corresponding to the miscompare and an operation of a writing step that wrote test data to said at least one location address of said at least a plurality of memory locations corresponding to the miscompare; and e) diagnosing a cause of the miscompare including correlating the miscompare data with known fault signatures.

2. The method according to claim 1, wherein the providing step includes storing the miscompare data in a buffer.

3. The method according to claim 2, wherein the exercising step continues uninterrupted while the providing step provides and stores the miscompare data.

4. The method according to claim 1, wherein said correlating the miscompare data with known fault signatures includes selecting said cause from a set of known causes.

5. The method according to claim 1, wherein said exercising step further includes executing a verification program containing the test data on a processor containing the embedded memory.

6. The method according to claim 5, wherein said executing step includes loading the verification program into the processor through input pins of an IC chip containing the processor.

7. In a method for testing RAM, the method including a plurality of operations each including writing to and reading from data locations in the RAM, and comparing data read from said data locations in the RAM with expected data values, the improvement comprising the steps of:

providing an address of a RAM location whose data miscompared with one of said expected data values; and providing operation information that identifies which of said plurality of operations resulted in a miscompare.

8. The improvement of claim 7 further comprising the step of storing the address of the RAM location and the operation information in a fail buffer.

9. The improvement of claim 8 further comprising the step of diagnosing a cause of the miscompare including correlating the operation information with known fault signatures.

10. A program storage device readable by machine, tangibly embodying a program of instructions executable by the machine to perform method steps for testing and diagnosing memory failures, said method steps comprising:

a) exercising an embedded memory, including writing to at least a plurality of memory locations in the embedded memory test data followed by reading data from said at least a plurality of memory locations, said writing and reading steps each including a plurality of operations;

b) simulating the exercising step to generate expected test read data;

c) comparing the data read from the embedded memory with the expected test read data;

d) providing miscompare data at each occurrence of a miscompare during the comparing step, the miscompare data including at least one location address of said at least a plurality of memory locations corresponding to the miscompare and an operation of a writing step that wrote test data to said at least one location address of said at least a plurality of memory locations corresponding to the miscompare; and e) diagnosing a cause of the miscompare including correlating the miscompare data with known fault signatures.

11. The method according to claim 10, wherein the providing step includes storing the miscompare data in a buffer.

12. The method according to claim 11, wherein the exercising step continues uninterrupted while the providing step provides and stores the miscompare data.

13. The method according to claim 10, wherein said correlating the miscompare data with known fault signatures includes selecting said cause from a set of known causes.

14. The method according to claim 10, wherein said exercising step further includes executing a verification program containing the test data on a processor containing the embedded memory.

15. The method according to claim 14, wherein said executing step includes loading the verification program into the processor through input pins of an IC chip containing the processor.

* * * * *